United States Patent [19]

Seiichi et al.

[11] Patent Number: 4,816,751

[45] Date of Patent: Mar. 28, 1989

[54] APPARATUS FOR INSPECTING THE OPERATION OF INTEGRATED CIRCUIT DEVICE

[75] Inventors: Nakane Seiichi; Nakamura Sigeru; Ikari Keniichi, all of Hiratsuka, Japan

[73] Assignee: Dakku Kabushiki-Kaisha, Kanagawa, Japan

[21] Appl. No.: 74,050

[22] Filed: Jul. 16, 1987

[30] Foreign Application Priority Data

Jul. 16, 1986 [JP] Japan ............................. 61-167600

[51] Int. Cl.⁴ ................... G01R 31/02; H01R 13/635
[52] U.S. Cl. ........................... 324/73 PC; 324/158 F;
439/70
[58] Field of Search ........... 324/158 F, 73 PC, 158 T, 324/133, 158 P; 361/403; 439/70, 330

[56] References Cited

U.S. PATENT DOCUMENTS 3,701,077 10/1972 Kelly, Jr. ............................. 439/70
3,870,953 3/1975 Boatman et al. ................ 324/158 T
4,195,258 3/1980 Yen .................................. 324/158 F
4,230,985 10/1980 Matrone et al. ................ 324/158 F

FOREIGN PATENT DOCUMENTS 1246101 9/1971 United Kingdom ............ 324/158 F

OTHER PUBLICATIONS

Northrop et al; "Isolation . . . "; IBM Tech. Disc. Bull.; vol. 3; No. 1; Jun. 1960; p. 7.
Defler, Jr., F. J.; "Sending . . . "; Microcomputing; Feb. 1984; pp. 16 19, and 20.

Primary Examiner—Ernest F. Karlsen
Attorney, Agent, or Firm—Fred Philpitt

[57] ABSTRACT

The present invention is concerned with an apparatus for inspecting the operation of a number of integrated circuit devices mounted on a printed circuit board. The apparatus includes a common lead-out connector unit that may be connected to and used with any one of a plurality of fitting units adapted for separately fitting to a plurality of the integrated circuit devices having a variable number of lead terminals for taking out signals at the integrated circuit devices. The apparatus makes it possible to take out signals simultaneously at all of the lead terminals of the integrated circuit devices for inspecting the operation of these devices for elevating the inspection efficiency of the integrated circuit devices having a variable number of the lead terminals.

2 Claims, 6 Drawing Sheets

APPARATUS FOR INSPECTING THE OPERATION OF INTEGRATED CIRCUIT DEVICE

BACKGROUND OF THE INVENTION

1. Field of the Invention

This invention relates to an apparatus for inspecting the operation of a number of integrated circuit devices, such as ICs or LSIs, mounted on a printed circuit board. More particularly, it relates to such apparatus whereby signals can be taken out simultaneously at all of the lead terminals of an integral circuit device for more prompt and efficient inspecting operation.

2. Description of the Prior Art

In inspecting the operation of integrated circuit devices, such as ICs or LSIs, mounted on a printed circuit board, so-called IC test clips are generally employed. The test clip is mounted on the integrated circuit device on the printed circuit board from above and a contact portion electrically connected with a contact pin projecting from the upper side of the clip is brought into pressure contact with the lead terminal of the IC device. The operation of the circuit mounted on the printed circuit board is inspected with a probe such as an oscilloscope electrically contacted with the contact pin.

FIG. 10 shows an example of the IC test clip of a so-called clothespeg type having body portions 50, 50 pivotally connected to each other by a pivot shaft 51. These body portions are biased by a spring 52 so that the lower ends of the body portions 50, 50 will be urged towards each other. Contact pins 53 projected from the upper ends of the body portions 50, 50 are electrically connected with the contact portions 54 at the lower ends of the body portions 50, 50. When attaching the IC test clip to the integrated circuit device, the lower ends of the body portions 50, 50 are extended apart against the bias of the spring 52. The test clip is attached to the device from above so that the latter is clamped between the extended apart lower portions. This causes the contact portions 54 to be pressure contacted with the lead terminals of the integrated circuit device.

FIG. 11 shows another example of the IC test clip. This test clip includes a pair of body portions 56, 56 pivotally connected to each other by a pivot shaft 55 and contact pins 57, 57 projecting from the upper ends of these body portion and electrically connected with contact portions 58 at the lower ends of the body portions 56, 56. When attaching the IC test clip to an integrated circuit device, a slide member 59 slidably mounted about the perimeter of the body portions 56, 56 is thrusted down until the contact portion 58 are brought into pressure contact with the lead terminals of the integrated circuit device.

In the operation of these IC test clips shown in FIGS. 10 and 11, the operation of the circuit device is inspected with the signals being taken out one at a time as the probe such as the oscilloscope is sequentially contacted with the contact pins 53 or 57.

When the inspection is performed with the use of a measuring unit such as a logic analyzer and with concurrent intake and processing of plural signals, end clips of a multiple probe may be engaged with plural contact pins 53 or 57 of the IC test clip for signal intake and processing. Alternately, a cable may be temporarily wound about or soldered to pins 53 or 57 with the other ends of the cable being connected to the measuring unit.

However, when the inspection is performed in this manner with concurrent processing of plural input signals with electrical connection being made to a plurality of lead terminals of the integrated circuit device, the aforementioned IC test clips adapted for sequentially taking out signals one at a time need be used sequentially for each of these lead terminals, so that the inspecting operation cannot be performed with higher inspecting efficiency.

SUMMARY OF THE INVENTION

It is a principal object of the present invention to overcome the aforementioned drawback of the prior art system and to provide an apparatus for inspecting the operation of integrated circuit devices whereby all test signals can be led out simultaneously at all of the lead terminals of the integrated circuit devices mounted on the printed circuit board for more prompt and reliable inspection operation.

It is another object of the present invention to provide such apparatus adapted for successfully dealing with the inspection of the operation of the integrated circuit devices having a variable number of lead pins or terminals.

It is a further object of the present invention to provide such apparatus which is versatile in operation, simple and easy to manufacture, more reliable in operation and low in manfacture costs.

In accordance with the present invention there is provided an apparatus for inspecting the operation of integrated circuit devices mounted on a circuit board, said apparatus comprising a fitting unit adapted for being fitted to said integrated circuit devices from above and adatped for being used with a desired one of a number of integrated circuit devices having a variety of lead terminal numbers; said fitting unit including a plurality of contactors adapted for being pressure contacted with a plurality of lead terminals of said integrated circuit devices and a plurality of connecting pins electrically connected to said contactors; a common lead-out connector unit adapted for being detachably connected to said fitting unit and including a plurality of connector-side connecting pins adapted for being connected in common to said connecting pins of said fitting unit; and a lead-out cable provided to said common lead-out connector unit and electrically connected with said connectorside connecting pins.

With the above construction of the present invention, once the inspection apparatus is attached to one of the integrated circuit devices mounted on the circuit board or printed circuit board, test signals can be taken out simultaneously at all of the lead terminals of the integrated circuit device through the lead-out cable of the common lead-out connector unit, thus resulting in significantly improved inspection efficiency.

Also, since the common lead-out connector unit is so designed that it can be optionally connected to any of a number of fitting units adapted for separately fitting to a number of integrated circuit devices having a variable number of lead terminals, the inspecting operation may be improved in operability.

DESCRIPTION OF PREFERRED EMBODIMENTS

In the accompanying drawings, there are shown preferred illustrative embodiments of the present invention.

Figure 1:
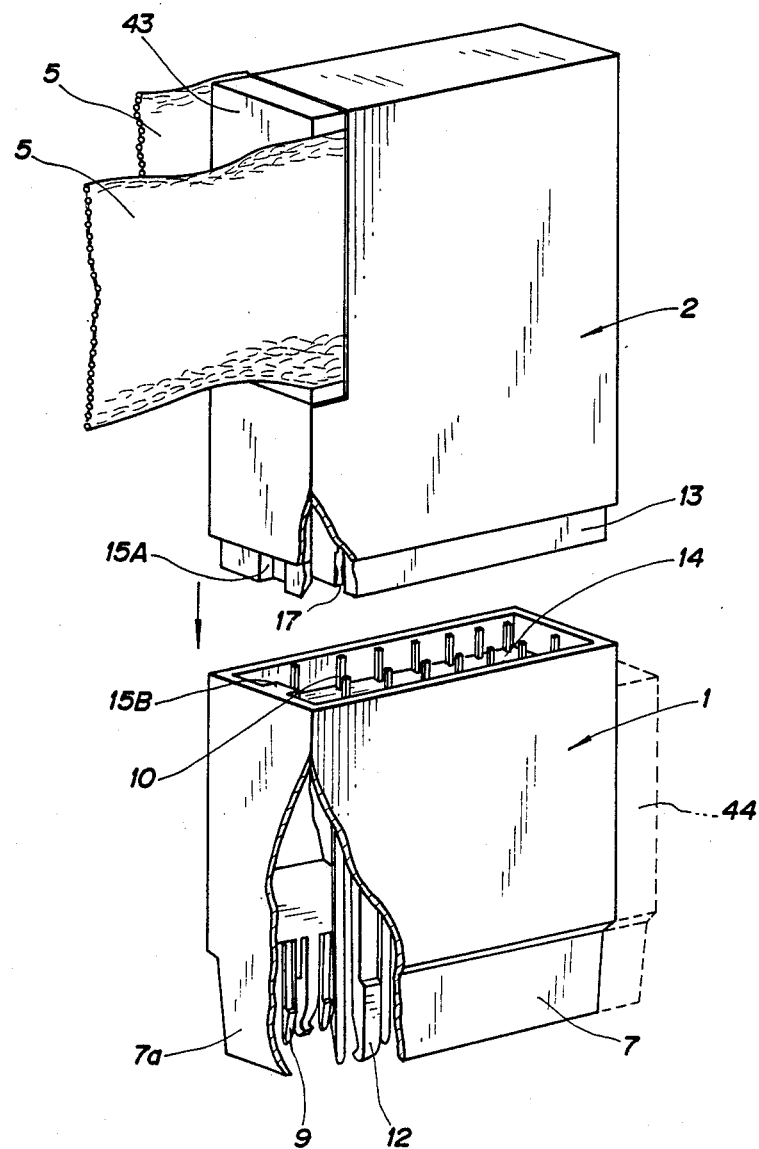
FIG. 1 is a perspective view of the apparatus for inspecting the operation of the integrated circuit device according to a preferred embodiment of the present invention, with portions thereof being removed.

FIG. 1 is an exploded perspective view showing an apparatus for inspecting the operation of integrated circuit devices according to a preferred embodiment of the present invention.

The inspection apparatus consists of a fitting unit 1 adapted for fitting from above to one of integrated circuit devices, such as ICs or LSIs, mounted on a printed circuit board, and a common lead-out connector unit 2 detachably mounted to the fitting unit 1. The inspection apparatus is so designed and arranged that the lead-out connecting unit 2 can be used in common in conjunction with any one of a variety of the fitting units 1 having the numbers of lead-out terminals or pins coincident with those of the lead-out terminals or pins of the integrated circuit devices to be inspected by the apparatus for their operation.

Figure 2:
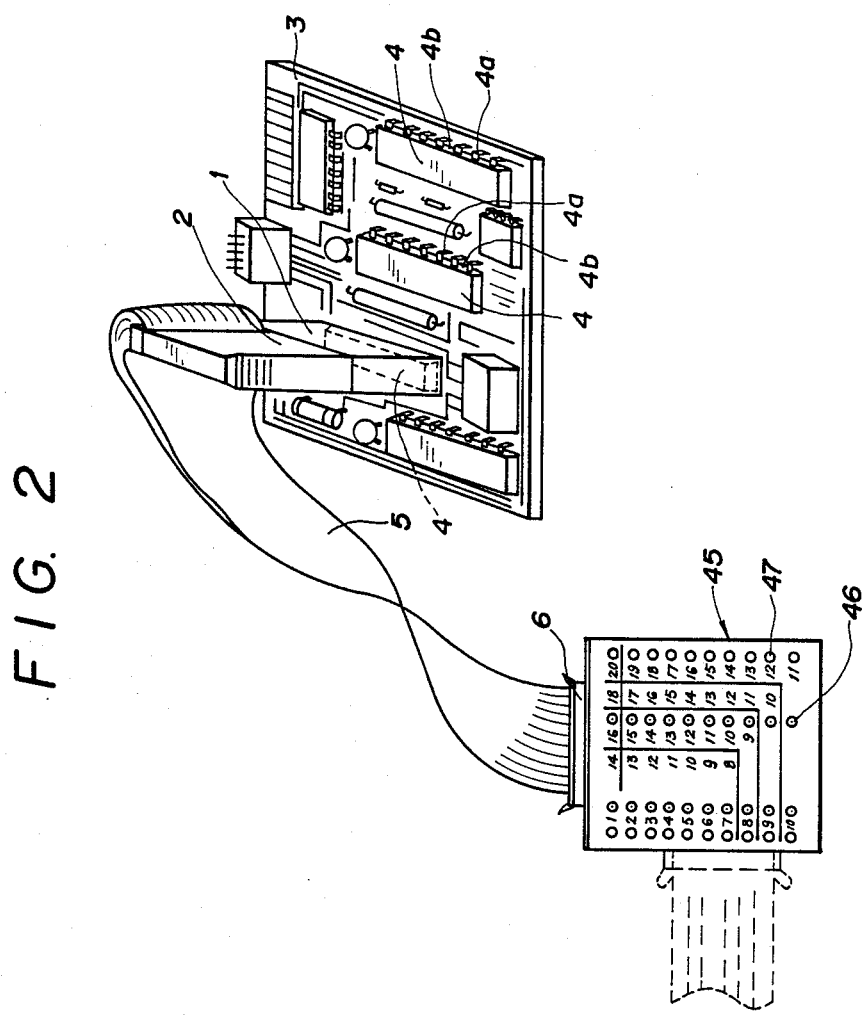
FIG. 2 is a perspective view showing the state of the inspection being conducted with the apparatus of FIG. 1.

In FIG. 2, there is shown the state in which the connecting unit 2 is connected to the fitting unit 1 which in turn is fitted to one of integrated circuit devices 4 mounted on a printed circuit board 3. The inspection of the operation of the integrated circuit devices 4 mounted on the printed circuit board 3 is performed in the operating state as shown in FIG. 2 wherein a connector 6 attached to a lead-out cable 5 of the connecting unit 2 is electrically connected to measuring units such as logic analyzer or a multiple logic tester. In FIG. 2, the connector 6 is connected to a multiple logic tester 45. This tester 45 is provided with a number of LEDs 46 capable of displaying the high and low states of the signals to permit visual inspection thereof and a number of control terminals 47 used for checking signals derived from the integrated circuit devices 4.

The fitting unit 1 of the present embodiment is designed to be mounted to dual-in-line package type (DIP type) integrated circuit devices, for example, 14-pin integrated circuit devices.

Figure 3:
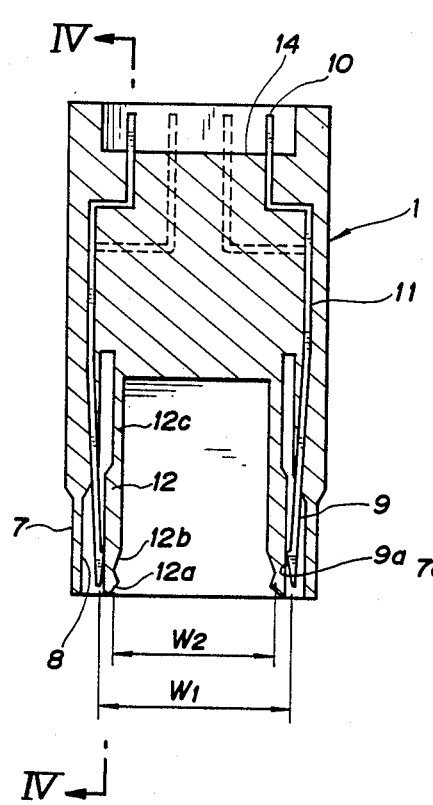
FIG. 3 is a sectional view taken along line III—III of FIG. 4 showing the fitting unit of the apparatus shown in FIG. 1.
Figure 4:
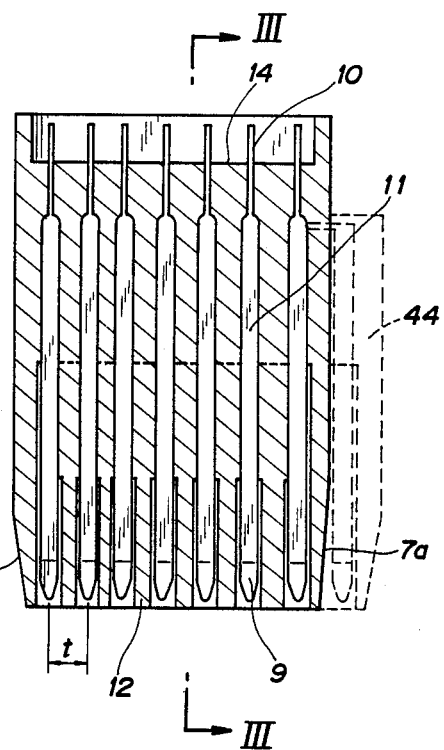
FIG. 4 is a sectional view taken along line IX—IX of FIG. 3 showing the fitting unit of FIG. 3.
Figure 5:
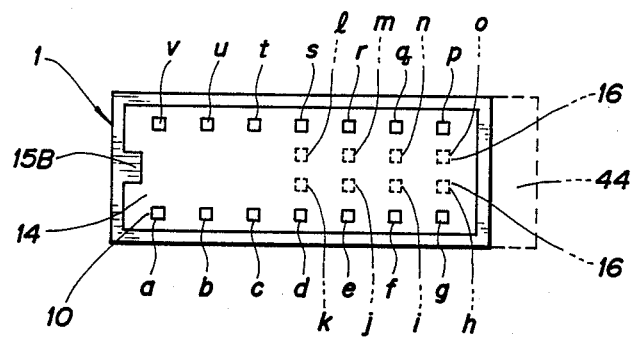
FIG. 5 is a plan view showing the fitting member of FIGS. 3 and 4.

In FIGS. 3, 4 and 5, the fitting unit 1 is shown in a front sectional view, a side sectional view and in a plan view, respectively.

This fitting unit 1 is cast integrally from, for example, a polybutadiene terephthalate resin or PBT resin reinforced by glass fibers. The bottom of the fitting unit 1 is formed by a skirt 7 defining a fitting recess 8 into which the integrated circuit device is fitted for inspection. It will be noted that the fitting unit 1 may also be formed of an ABS resin reinforced by glass fibers, a polyamide resin reinforced by glass fibers, a polyphenylene sulfide resin or PPS resin or a ceramic material exhibiting moderate resiliency.

A number of rod-like contactors 9 are projected downwards into the fitting recess 8 so as to be pressure contacted with lead terminals 4a of the integrated circuit device 4, as shown in FIG. 2. These contactors 9 are electrically connected through associated inner conductors 11 with connecting pins 10 extended to a space above the fitting section 1 as later described. The contactors 9 as well as the inner conductors 11 and the connecting pins integral therewith may be formed of copper, brass, nickel or phosphor bronze.

The inner conductors 11 are bent slightly inwards so that the distance W1 between the contact surfaces of the opposing contactors 9 is slightly narrower than that between the opposing lead terminals 4a of the integrated circuit device 4. By such narrow distance W1 and the resiliency of the contactors 9, the latter can be brought into a positive pressure contact with the associated lead terminals 4a for assuring a positive electrical connection between the contactors 9 and the associated lead terminals 4a. The foremost part of each contactor 9 is formed with a taper towards the tip so that the contact surface of the contactor 9 is guided by a tapered surface 9a into smooth and positive pressure contact with the associated lead terminal 4a.

Since the fitting unit 1 of the present embodiment is designed to be used in conjuction with a 14-pin integrated circuit device 4, seven contactors 9 are arranged in a transverse row on each side of the fitting section 1, so that the totality of fourteen contactors 9 project into the fitting recess 8. The distanct t between the adjoining contactors 9 on both sides of the fitting section 1 is selected to be equal to the pitch of the lead terminals 4a of the DIP type integrated circuit devices 4.

A plurality of tongue-like projections 12 are formed integrally with the fitting unittion 1 for projecting down into the recess 8 for holding both lateral surfaces 4b of the integrated circuit device 4 from both sides thereof. The foremost part of each of these projections 12 is formed with a tapered surface 12a for guiding the lateral surface 4b therealong and a recess 12b is formed above the tapered surface 12afor engaging with a mating raised portion on the lateral surface 4b. The proximate end of the projection 12 has a slightly reduced thickness for affording moderate resiliency thereto.

These projections 12 are disposed inwardly of the associated contactors 9 such that the distance W2 between the opposing projections 12 is slightly smaller than the width of the body member of the integrated circuit device 4 obtained as by molding. The body portion of the device 4 can be held positively by virtue of the narrow distance W2 and the resiliency of the holding projections 12, so that the fitting unit 1 has a tight fit with the IC device 4.

It will be noted that the projections 12 are disposed in the staggered relation with respect to the contactors 9 so that, when the fitting unit 1 is fitted to the IC device 4, each projection 12 is engaged in the gap between the adjoining lead terminals 4a. This results in positive engagement of the fitting units 1 with the integrated circuit device 4 and prevention of the longitudinal deviation of the fitting section 1 relative to the IC device 4. Such deviation is also provented by the presence of the skirt 7a at the longitudinal ends of the fitting section 1.

On the top of the fitting unit 1 is formed a mating recess 14 into which is fitted a mating projection 13 on the bottom of the connecting section 2. A positioning lug 15B is formed on the recess 14 for mating with a cut-out 15A formed in the mating projection 13. A number of connecting pins 10 are arranged within the recess 14 for connection with the contactors 9. In the present embodiment, seven such connecting pins 10 are provided in a transverse row on each longitudinal side so that a totality of fourteen connecting pins 10 are provided in the recess 14.

The above described fitting unit 1 is adapted to be used in conjunction with a DIP type 14-pin integrated circuit device. As an alternative, it can also be adapted for use with a DIP type 16-pin integrated circuit device by providing an extension 44 to a main body of the unit 1 as shown by a broken line in FIG. 4 and by providing two more contactors and two more holding projections, with the shape of the mating recess 14 unchanged. Two connecting pins 6, 16 may be provided as shown in FIG. 5 for connection with the extended contactors 9. In the illustrated example of the fitting unit 1, an extension may be annexed to the right side of the unit 1, an extension may be annexed to the right side of the unit 1 in FIG. 1 so that the unit 1 can be fitted to the DIP type device 4 having twenty-two pins at the maximum. In this case, the number of connecting pins same as the number of the contactors in the annexed extension may be provided in the mating recess 14. In the case of the 22-pin circuit device, the thus added connecting pins may be provided at all of the positions indicated by the broken lines in FIG. 5.

It will be noted that the DIP type integrated circuit devices are classified into two groups depending on the interval or gap width between the adjoining lead terminals 4a, with the first group including 8-, 14-, 16-, 18-, 20- and 22 pin devices and the second group including 24-, 28-, 36-, 40- and 48 pin devices.

The mating recess 14 remains the same in shape for the first group. The manner in which the numbers of the actual lead pins or terminals are associated with the connecting pins 10 will now be described by taking examples of 14-, 16 and 22 pin circuit devices.

Thus, with the 14 pin circuit device, the pin numbers 1 to 7 are associated with the connecting pins a to g while the pin numbers 8 to 14 are associated with the connecting pins p to v.

In the case of 16 pin device, the pin numbers 1 to 8 are associated with the connecting pins a to h while the pin numbers of 9 to 16 are associated with the connecting pins o to v.

In the case of a 22 pin device, the pin numbers of 1 to 11 are associated with connecting pins of a to k while the pin numbers of 12 to 22 are associated with connecting pins l to v.

If desired, twenty-two pins 10 may be provided in the mating recess 14 and the pins that may be occasionally out of use may remain free, that is, may remain disconnected from the associated contactors.

The construction of the common lead-out connector unit 2 is now described.

Figure 6:
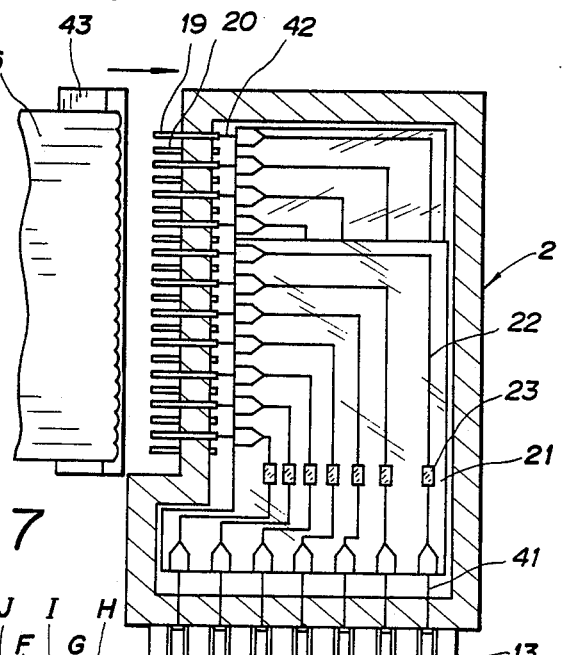
FIG. 6 is a sectional view taken along line VI—VI of FIG. 8 showing a common lead-out connector unit of the inspection apparatus shown in FIG. 1.
Figure 7:
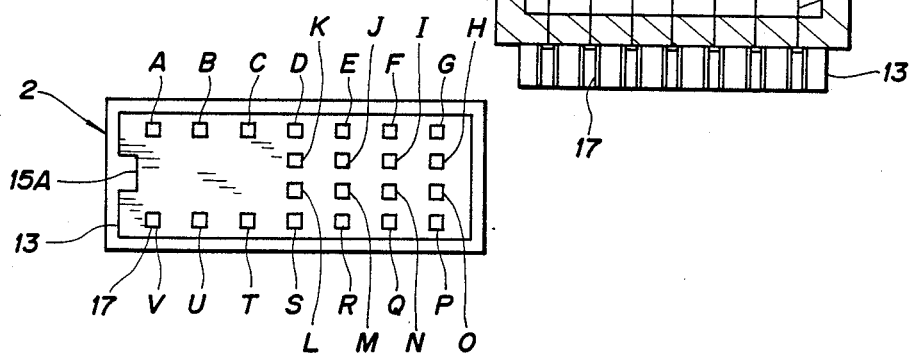
FIG. 7 is a bottom plan view of the common lead-out connecting unit shown in FIG. 6.

FIGS. 6 and 7 are a cross-sectional side view and a bottom plan view of the connector unit 2, respectively.

The connector unit 2 is cast integrally from the same material as that of the fitting unit 1. On the bottom surface of the mating projection 13 engaged with the mating recess 14, there are formed twenty-two female type connecting pins 17 for electrical connection with the connector pins 10 of the mating recess 14. The manner in which these twenty-two connecting pins 17 are arranged on the mating projection 13 is the same as that in which up to twenty-two connecting pins 10 are provided to the mating recess 14. The connecting pins 17 indicated by upper case letters in FIG. 7 are associated with the connecting pins 10 on the mating recess 14 indicated by the same lower case letters in FIG. 5. For example, the connecting pin 17 of the connecting section 2 is connected to the pin a.

Figure 8:
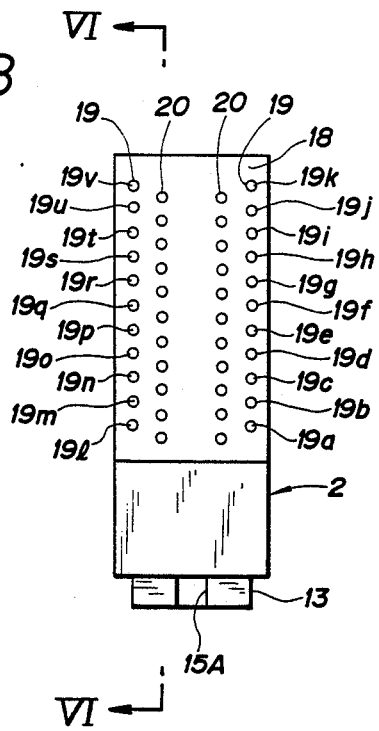
FIG. 8 is a front plan view showing the common lead-out connector unit shown in FIGS. 6 and 7.
Figure 10:
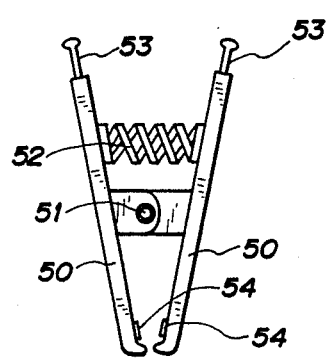
FIG. 10 is a front view showing a conventional IC test clip.
Figure 11:
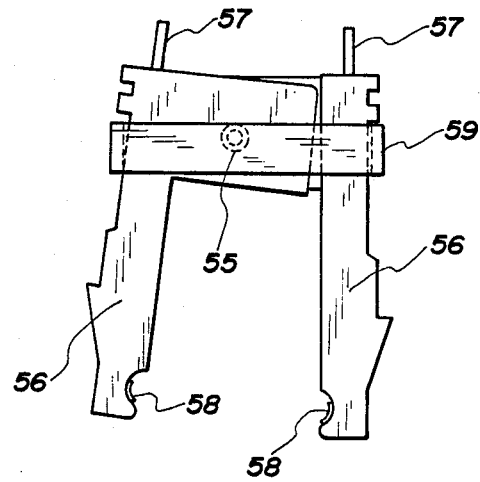
FIG. 11 is a front view showing another conventional IC test clip.

As shown in a front view of FIG. 8, forty-four pressure peel-off pins 19, 20 are projectedly mounted to a forward stepped portion 18 of the common lead-out connecting unit 2. These forty-four pins are so arranged that eleven pins 19 are arranged in a staggered relation to eleven pins 20 on each longitudinal side of the stepped portion 18. It is only the pressure peel-off pins 19 on both side rows that are connected to the connecting pins 17 of the connecting unit 2.

The connecting pins 17 of the connecting unit 2 and the pressure peel-off pins 19 are associated with one another in such a manner that the connecting pins 17 of from A to K are connected to the pressure peel-off pins 19 of from 19a to 19k, respectively, while the connecting pins 17 of from L to V are connected to the pressure peel-off pins 19 of from 19l to 19v, respectively.

The electrical connection between the connecting pins 17 and the pressure peel-off pins 19 is made by a pattern conductor 22 which is pattern printed on, for example, a flexible print board 21 contained in the connector unit 2. The electrical connection between the printed circuit board 21 and the connecting pins 17 is made so that the wires 41 connected to the connecting pins 17 are soldered to the pattern conductor 22 as by ultrasonic heating. The electrical connection between the circuit board 21 and the pins 19 is also made so that the wires 42 connected to the abutment pins 19 are similarly soldered to the pattern conductor 22.

A chip 23 consisting of a chip resistor and a chip capacitor may be mounted halfway in each of the pattern conductors 22. The chip resistor of approximately 9 megaohms and the chip capacitor of approximately 20 to 30 picofarads may be employed. These chips are effective to compensate for deterioration in the frequency response of the signals of the high frequency range and also for the possible influence on the integrated circuit devices otherwise caused when the lead-out cable 5 is extended to a longer length.

To these pressure peel-off pins 19, 20, the lead-out cable 5 consisting of, for example, a twist flat cable 5 supported on a mounter 43, is connected by pressure peel-off of the cable sheath in a known manner. One of the twin cables is connected to the pressure peel-off pin 19 connected to the connecting pin 17 for taking out signals while the remaining twin cable is connected to the free pressure peel-off pin 20. The cable connected to the free pressure peel-off pin 20 is grounded at the measurement unit connected to the other end of the cable. The signal to noise ratio may be improved by taking out the signals by the twist cable in this manner.

To the other side of the lead-out connector 5, there is connected the connector 6, for example, as shown in FIG. 2, this connector 6 being connected to the measurement unit adapted for inspecting the operation of the IC device. The correlation between the pin numbers of the connector 6 and those of the integrated circuit devices to which the fitting unit 1 is mounted may be previously known so that the pin numbers of the integrated circuit devices can be determined easily during inspection of the operation of the circuit devices.

The marginal portions of the mating projection 13 and recess 14 free of the connecting pins 10, 17 may be provided with pole number signal pins for automatically determining the pin numbers. These signal pins may be used for coding the number of pins or poles. In the DIP type integrated circuit devices, since there are six kinds of poles in the first group and five kinds of poles in the second group, it suffices to use three pole number signal pins and a single common pin for binary coding of the pole or pin numbers.

In the inspection apparatus of the present invention, the fitting unit 1 having the number of the contactors coincident with that of the lead pins or terminals may be fitted to the integrated circuit device from above and the common lead-out connector unit 2 may be connected to the fitting unit 1 in such a manner that the signals at the lead-out terminals of the integrated circuit device may be simultaneously taken out at the lead-out cable 5 of the connecting unit 2.

Therefore, the lead-out cable 5 can be connected to measurement units such as the logic analyzer or multiple logic tester for inspecting the operation of the integrated circuit devices more efficiently than was possible with the conventional system.

It will be noted that the inspection apparatus for the IC devices of the second group may be constructed by using the 24-pin IC device as the reference, that is, by designing the fitting unit 1 for snugly engaging with the IC device of the group and designing the contacting unit 2 for common connection to one of the fitting unit.

The connecting pins 10 of the fitting unit 1 may be designed as the female pins instead of as the male pins while the connecting pins 17 of the common lead-out connector unit 1 may be designed as the male pins.

Figure 9:
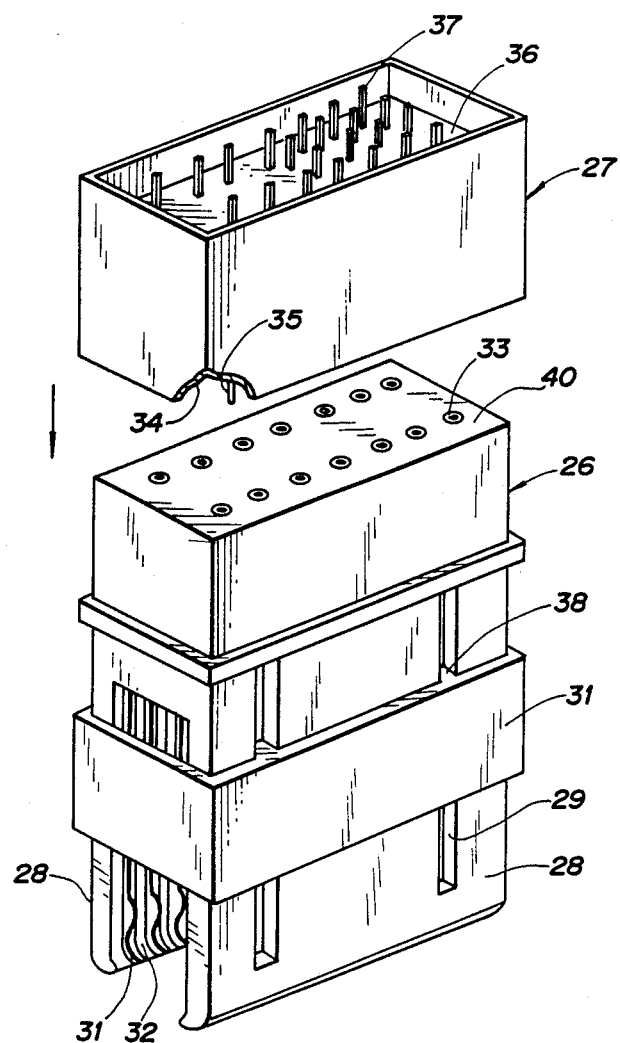
FIG. 9 is a prespective view showing a fitting unit according to a modification.

In FIG. 9, there is shown a modified embodiment of the present invention in a perspective view.

In the present modification, the fitting unit 1 is divided into a fitting section 26 of the lower block and a converting section 27 of the upper block.

The fitting section 26 of the lower block is cast integrally from the same material as that of the fitting unit 1. The fitting section 26 is provided with resilient side elements 28, 28 that are spread towards the lower ends slightly outwards. A slide member 30 is provided about the perimeter of these side elements 28, 28 for sliding vertically by being guided along slide guide grooves 29 formed vertically on the lateral sides of the side elements 28, 28. When the slide member 30 having mating projections 38 engaging with the slide guide grooves 29 is thrusted downwards, the lower ends of the side elements 28, 28 are narrowed inwards so that the IC device pinched in between the inner sides of the lower extreme ends of the side elements 28, 28 may be held thereby more strongly.

On the inner surface of the lower extreme ends of the side elements 28, a number of contactors 13 are provided for pressure contact with lead terminals of the IC device. In the present modification, since the fitting portion 26 if designed for fitting with a 14-pin DIP type IC device, for example, seven contactors 31 are provided in a transverse row on each side element 28 so that the sum total of fourteen contactors are provided to the side elements 28, 28. A number of pawl-like projections 32 are provided between the adjoining contactors 31 for intruding into the space between the lead terminals of the IC device for holding the lateral surfaces of the main body of the IC device.

The upper ends of the side elements 28, 28 are connected integrally to each other and, on an upper surface 40 of the fitting section 26, female connecting pins 33 are provided with the same array and in the same number as the contactors 31 for electrical connection with these contactors 31.

The converting section 27 of the upper block is cast integrally from the same material as the fitting unit and formed at the bottom thereof with a mating recess 34 for snugly engaging with the upper portion of the fitting portion 26. Within the mating recess 34, male connecting pins 35 are provided in the same number as the connecting pins 33 of the fitting portion 26 for electrical connection with these connecting pins 33.

The upper end of the converting section 27 is formed as a mating recess 36 for snugly receiving the mating projection 13 of the common lead-out connecting section 2. Within the mating recess 36, a plurality of, herein twenty-two, female connecting pins 37 are provided for electrical connection with the connecting pins 17 of the connector unit 2. Among these twenty-two connecting pins 37, fourteen connecting pins 37 on both sides of the converting portion 27 are connected separately to the connecting pins 35 within the inner space of the converting portion 27, while the eight central connecting pins 37 remain intact.

It will be noted that, when the fitting section 26 is designed for use with a DIP type 22-pin IC device, twenty-two connecting pins 35 of the converting section 27 are provided to the bottom of the converting section such that all of the upper connecting pins 37 are separately connected to these connecting pins 35.

By thus providing the converting section 27, the fitting section 26 can be connected through this converting section 27 to the common lead-out connecting section 2 despite the fact that different kinds of the fitting section 26 are occasionally employed for fitting to IC devices having a different number of the lead terminals.

It will be noted that female pins may be used as the connecting pins 33 of the fitting section and female pins as the connecting pins 35 of the converting section.

The fitting section 26 may be used by itself as the IC test clip. In such case, when the connecting pin 33 is a female pin, the foremost part of a needle-like probe of a measuring device may be applied to a recess of the connecting pin 33 for confirming the presence of an electrical signal. In distinction from the conventional IC test clip having the male pin type contact pin, mistaken contact with the adjoining connecting pin 33 may be prevented more reliably. Also, in distinction from the conventional IC test clip, the upper surface 40 is flat and may have a larger area, so that the pin number designation may be provided on this flat upper surface 40 for elevating the inspection efficiency.

Although the fitting unit 1 and the fitting section 26 are designed for fitting with DIP type IC devices in the above described respective embodiments, the unit 1 and the section 26 may also be designed for fitting with flat package type IC devices.

When the fitting unit 1 and the fitting setion 26 are designed with the use of the male pins as the contactors to permit electrical connection thereof to IC sockets, the inspection apparatus of the present invention may also be used as the connection plug for supplying signals to in-circuit simulators. Since the connection can be made to IC sockets with a variable number of pins without exchanging lead-out cables, debugging or evolution of electronic devices making use of the in-circuit simulators may be implemented more efficiently.

It will be appreciated from the foregoing that the present invention provides an arrangement in which the fitting unit is fitted on the IC device mounted on a printed circuit board and a common lead-out connector is connected to the fitting unit, so that signals may be taken out at the totality of the lead-out terminals of the IC device through a lead-out cable of the connecting unit.

Since there is not so far known a general purpose inspection apparatus wherein all signals can be taken out at a common cable from the totality of the lead-out terminals of the IC device having a variable number of poles, the inspection apparatus of the present invention has a great practical utility.

Since all signals can be taken out simultaneously at the time of inspection of the operation of the IC devices, the time necessary for inspection may be drastically reduced as compared to the conventional practice of taking out signals sequentially for a given inspection operation. Since all signals may be checked simultaneously, the signal state can be grasped more easily to permit the inspection with an improved reliability. Contrary to taking out signals sequentially, it becomes possible to prevent an error in reading lead pin or terminal number of IC devices or in prove abutment or the occurrence of shorting thus resulting in further improved reliability in the inspection operation.

In addition, the common lead-out connecting unit may be optionally connected in common to one of a plurality of fitting units adapted for separately fitting to IC devices having a variable number of lead terminals. Therefore, only the fitting unit need be exchanged during the inspection of the IC devices having a variable number of lead terminals, thus again resulting in an improved inspection efficiency.

The inspection apparatus of the present invention may be used most advantageously for inspecting the operation of the dedicated LSIs, such as MPUs, bus buffer ICs, LSIs for I/O ports or LSIs for general purpose interface buses (GPIBs).

When the inspection apparatus is used for checking the acceptability of the small-lot printed circuit boards carrying IC devices and the resulting output signals are introduced from the apparatus into inspecting units, the time necessary for inspection may be reduced with prevention of inspection errors.

What is claimed is:

1. An apparatus for inspecting the operation of an integrated circuit device (4) mounted on a circuit board (3) that contains a plurality of lead terminals (4a) and a main body having lateral surfaces (4b), said apparatus comprising in combination:
    (a) a fitting unit (1) that is adapted to be fitted from above to said lateral surfaces (4b) of said integrated circuit device (4) and to its lead terminals (4a), said fitting unit including
        (1) a plurality of contactors (9) that are adapted to be pressure fitted with said lead terminals (4a), and
        (2) a plurality of connecting pins (1) electrically connected to said contractors (9), and
        (3) a plurality of pawl-like projections (12) arranged between adjacent contactors (9), said projections being adapted to engage the sides of said lateral surfaces (4b) of said integrated circuit device, and
    (b) a common lead-out connector unit (2) which is adapted to be detachably connected to said fitting unit (1), said connection unit (2) including
        (1) a plurality of connecting pins (17) that are adapted to be electrically connected to said connecting pins (10) of said fitting unit (1), and
        (2) a lead-out cable (5) which is electrically connected to said connecting pins (17).

2. An apparatus for inspecting the operation of an integrated circuit device (4) mounted on a circuit board (3) that contains a plurality of lead terminals (4a) and a main body having lateral surfaces (4b), said apparatus comprising in combination:
    (a) a fitting unit (1) that is fitted from above to said lateral surfaces (4b) of said integrated circuit device (4) and to its lead terminals (4a), said fitting unit including
        (1) a plurality of contactors (9) that are pressure fitted with said lead terminals (4a), and
        (2) a plurality of connecting pins (1) electrically connected to said contractors (9), and
        (3) a plurality of pawl-like projections (12) arranged between adjacent contactors (9), said projections engaging the sides of said lateral surfaces (4b) of said integrated circuit device, and
    (b) a common lead-out connector unit (2) detachably connected to said fitting unit (1), said connection unit (2) including
        (1) a plurality of connecting pins (17) that are electrically connected to said connecting pins (10) of said fitting unit (1), and
        (2) a lead-out cable (5) which is electrically connected to said connecting pins (17), and
    (c) a logic tester (45) connected to said lead-out cable (5) which includes display means (46) for displaying signals appearing at said lead terminal of said integrated circuit device (4).

* * * * *

UNITED STATES PATENT AND TRADEMARK OFFICE
CERTIFICATE OF CORRECTION

PATENT NO. : 4,816,751

DATED : March 28, 1989

INVENTOR(S) : SEIICHI NAKANE and SIGERU NAKAMURA and KENIICHI IKAR

It is certified that error appears in the above-identified patent and that said Letters Patent is hereby corrected as shown below:

On the title page:

[75] Inventors: SEIICHI NAKANE; SIGERU NAKAMURA; KENIICHI IKARI; all of Hiratsuka, Japan Signed and Sealed this Twentieth Day of November, 1990

*Attest:*

HARRY F. MANBECK, JR.

*Attesting Officer*     *Commissioner of Patents and Trademarks*